United States Patent [19]

Buttars

[11] Patent Number: 5,339,536
[45] Date of Patent: Aug. 23, 1994

[54] APPARATUS AND METHOD FOR SOLDER PASTE PRINTING PROCESS FOR PRINTED CIRCUIT BOARDS

[75] Inventor: Scott K. Buttars, Spring, Tex.

[73] Assignee: Compaq Computer Corporation, Houston, Tex.

[21] Appl. No.: 124,566

[22] Filed: Sep. 20, 1993

Related U.S. Application Data

[63] Continuation of Ser. No. 924,851, Aug. 4, 1992, abandoned.

[51] Int. Cl.$^5$ .............................................. G01B 5/14
[52] U.S. Cl. ........................................ 33/613; 33/501; 33/562
[58] Field of Search ............. 33/562, 563, 501.3, 33/836, 501, 567, 533, 613, 834

[56] References Cited

U.S. PATENT DOCUMENTS

| | | | |
|---|---|---|---|
| 1,563,468 | 12/1925 | Carreau, Jr. | 33/501 |
| 2,501,036 | 3/1950 | Fay | 33/501 |
| 3,170,243 | 2/1965 | Williams | 33/836 |
| 3,624,685 | 11/1971 | Babcock | 33/501 |
| 5,048,195 | 9/1991 | Leonov | 33/533 X |
| 5,205,456 | 4/1993 | Barnett et al. | 33/533 |

FOREIGN PATENT DOCUMENTS

| | | | |
|---|---|---|---|
| 0075601 | 6/1980 | Japan | 33/836 |
| 1337646 | 9/1987 | U.S.S.R. | 33/533 |

OTHER PUBLICATIONS

"Instruction Manual" for GSP Screen Printer, published by FUJI Machine Mfg. Co., Ltd., 26 pages total with cover pages and Table of Contents (No Date).
"Parameters for Solder Paste Printing" by Scott K. Buttars, Compaq Computer, Houston, Tex., 8 pages total (No Date).
"Applying Kester Solderpaste To Surface Mount Assemblies" by Eric Slezak, dated Jul. 25, 1989, 3 pages total including cover pages and pp. 7 and 8.
"SST-a handbook for the screen printer" issued by Schweiz, Seidengazefabrik AG Thal, 24 pages total including Chapter 9. (No Date).
"Solder Paste In Electronics Packaging, Technology and Applications in Surface Mount, Hybrid Circuits, and Component Assembly" by Jennie S. Hwang, Copyright ©1989 by Van Nostrand Reinhold, 41 pages total including cover sheets and Chapter 6.

Primary Examiner—William A. Cuchlinski, Jr.
Assistant Examiner—Alvin Wirthlin
Attorney, Agent, or Firm—Pravel, Hewitt, Kimball & Krieger

[57] ABSTRACT

Apparatus for indicating a predetermined snap-off between a circuit board and a stencil in a solder paste printing process for printed circuit boards. The apparatus includes a triangular shaped plate having a lever member, where a portion of the lever member extends through a stencil hole for engaging the circuit board. The plate further includes two support members for resting on top of the stencil. The centroid of the weight of the plate is between the two support members and the lever member to urge the plate to pivot about the two support members. On the end opposite the two support members is an indicator cone for indicating the predetermined snap-off of the circuit board relative to the stencil. Advantageously a method for positioning the stencil and the circuit board at a predetermined snap-off during the solder paste printing process for printed circuit boards is also disclosed.

21 Claims, 2 Drawing Sheets

APPARATUS AND METHOD FOR SOLDER PASTE PRINTING PROCESS FOR PRINTED CIRCUIT BOARDS

This is a continuation of co-pending application Ser. No. 07/924,851 filed Aug. 4, 1992, now abandoned.

BACKGROUND OF THE INVENTION

1. Field of the Invention

This invention relates generally to a method and apparatus for printing solder paste for printed circuit boards and, more particularly, to an apparatus for indicating a predetermined snap-off between a circuit board and a mask used during the solder paste printing process.

2. Description of the Prior Art

During the conventional solder paste printing process, solder paste is used to form the interconnections between electronic components and the circuit board. The solder paste is preferably supplied in an amount sufficient to provide both electrical and mechanical connections without producing bridging.

The basic materials used in the solder paste printing process are masks comprising a stencil or screen; squeegee; solder paste and a circuit board. Variables besides these basic materials that affect print quality are printing machine parameters or settings. Some of the machine settings or parameters comprise the following items, squeegee speed and pressure, snap-off and the relative parallelism of the circuit board, stencil/screen and the squeegee. For example, the squeegee shape and hardness will affect the end result of the solder paste printing process. Also, the type of solder paste used including its viscosity, tackiness, particle size and percent metals will effect the end result of the process.

Of the two methods of printing solder paste, stencil printing is presently the most prevalent method used though screen printing is still used in many instances. Stencil printing allows the use of solder paste with larger particle size and a higher viscosity. However, one of the more critical setup requirements for the stencil printing equipment is snap-off. Snap-off is defined as the distance between the circuit board and the stencil. One of the benefits of proper snap-off is better separation of the stencil from the circuit board after the solder paste has been deposited. Also, too much snap-off makes it difficult to maintain the X-Y alignment of the stencil and smearing becomes more of a problem. Snap-off is usually small, approximately 0.040 inches. However, as a rule of thumb the maximum snap-off used should not exceed ten times the stencil thickness.

During the solder paste printing process, the stencil completely covers up the entire circuit board leaving no access from the sides or below to determine if the proper snap-off has been achieved. One of the ways that snap-off is measured is through a hole in the stencil. Particularly, a pin is stuck down through the stencil hole until it engages the circuit board, marked and the distance on the marked pin is then measured. If the desired snap-off is not achieved, then the stencil or the circuit board is moved and the measurement taken again. If the desired snap-off is still not achieved, the stencil or the circuit board would be moved again and the measurement would be taken again.

Another method for setting the snap-off is designed for use with the Fuji GSP-II screen printer manufactured by Fuji Machine Manufacturing Company, Ltd. of Japan. In this method, the circuit board is positioned onto the vacuum plate of the GSP screen printer. The stencil is secured to a frame on the GSP screen printer. The frame, positioned above the vacuum plate, is raised. The vacuum plate holding the circuit board is then lowered to its lowest position by using the "snap-off" control hand crank. A bare board with a predetermined height equal to the desired snap-off distance of 0.040" is then centrally positioned on top of the circuit board. The frame with the stencil is lowered. The snap-off control hand crank is turned to move the vacuum plate upward until the top of the bare board "just" touches the underside surface of the stencil. This touching of the board to the stencil can be seen through the holes in the stencil. If the stencil begins to deflect upward the snap-off hand crank is backed off (moving the vacuum plate downward) to lower the circuit board. This position is then set into the memory of the GSP screen printer. The frame with stencil is then raised, the bare board removed from the circuit board, and the frame is returned to its set position. Subsequently the squeegee is used to apply the solder paste and the electronic components are then placed onto the paste. The circuit board with the paste deposited on it is then sent through an infrared oven where it becomes liquidous and solders the electronic components in place.

An alternative to the above FUJI method for setting the snap-off is to use a 0.040 inch thick plastic 5"×5" shim gauge with one side painted red instead of the above discussed bare board. This 5"×5" red shim gauge is centrally positioned on the circuit board where the red painted side can be seen through the stencil holes. Both the bare board and red shim guage methods of setting the snap-off require that the entire board/guage touch the bottom of the stencil not just the corners since the board/guage may be slightly bowed. In some cases the operator is unable to determine when the shim gauge is fully engaging the stencil, making the accuracy less than desired. An easier and more accurate method to measure snap-off is desired in the industry.

SUMMARY OF THE INVENTION

According to the invention, an apparatus for indicating a snap-off between a circuit board and a mask is provided for a solder paste printing process. The apparatus includes a triangular shaped plate having a lever member and two support members. The lever member extends through a stencil hole to engage the circuit board. The lever member includes a first cylindrical section sized to be received through the stencil hole and a larger second cylindrical section having a shoulder. The centroid of the weight of the plate is between the two support members and the lever member to urge the plate to pivot about the two support members. On the end opposite the two support members is an indicator cone for indicating the desired snap-off of the circuit board relative to the stencil.

Advantageously, a method for positioning the stencil at a predetermined snap-off from the circuit board is also provided. By moving either the circuit board or the stencil, the indicator means on the plate can indicate the predetermined snap-off.

BRIEF DESCRIPTION OF THE DRAWINGS

The objects, advantages and features of the invention will become more apparent by reference to the drawings which are appended hereto and wherein like numerals indicate like parts and wherein an illustrated embodiment of the invention is shown, of which.

DETAILED DESCRIPTION OF PREFERRED EMBODIMENT

Figure 1:
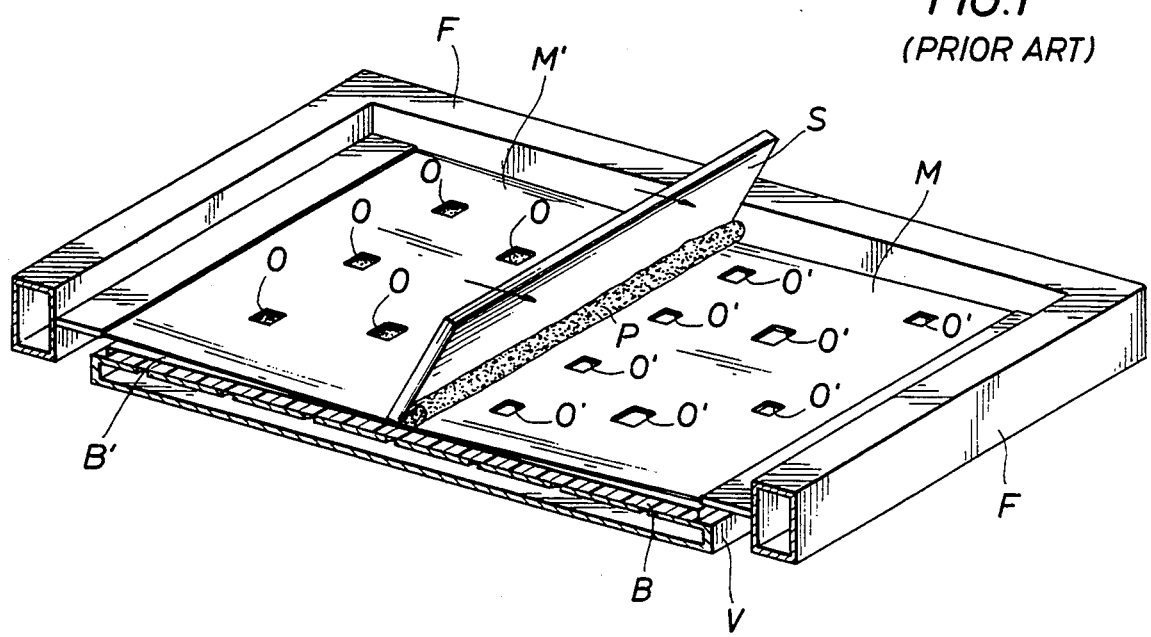
FIG. 1 is a perspective view of the frame holding the stencil above the circuit board lying on top of a vacuum plate, all shown in section, with a squeegee applying the solder paste to the circuit board.
Figure 5:
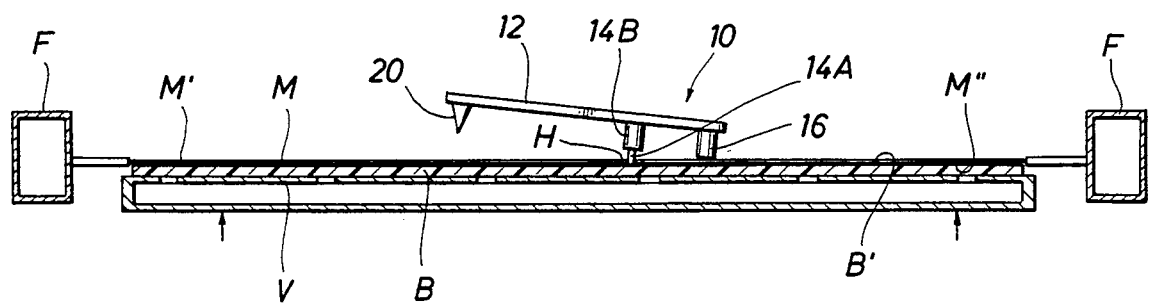
FIG. 5 is the apparatus of the present invention as shown in FIG. 3 positioned on the stencil, shown in section, with the lever member extending through a stencil hole to engage the circuit board, also shown in section.
Figure 6:
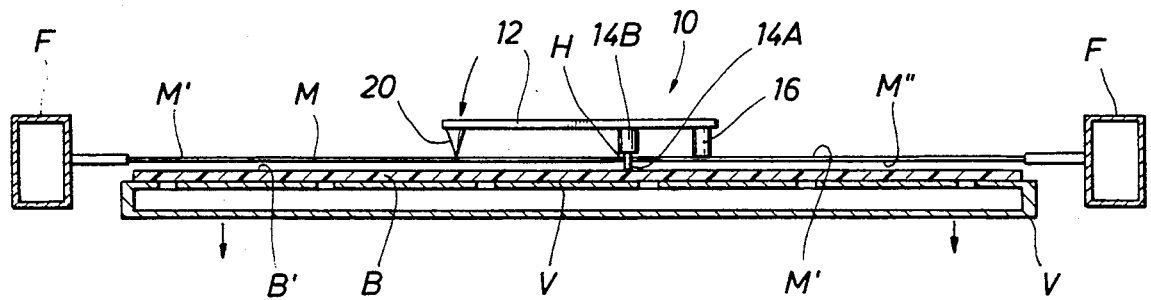
FIG. 6 is a view similar to FIG. 5 with the indicator cone of the present invention engaging the stencil to indicate a predetermined snap-off.

An apparatus, generally indicated at 10, for indicating a predetermined distance or snap-off between a circuit board B having a first or upper surface B' and a mask M is disclosed. The mask or stencil M has an upper or first surface M' and a hole H is provided in the mask M, as best shown in FIGS. 5 and 6. The stencil M is held in a frame F of the printer to position the stencil M above the circuit board B positioned on top of vacuum plate V. As best shown in FIG. 1, after the predetermined snap-off is achieved between the board surface B' and the stencil surface M', a squeegee S is used to apply the solder paste P to the circuit board surface B' through openings in the stencil M. As best shown in FIG. 1, after the squeegee S has passed over the stencil M with the paste P, the openings O are filled. The paste is applied to the circuit board in the same configuration as the openings O. As seen in FIG. 1, the openings O' are shown prior to the paste P being applied by the stencil S. Squeegee S is generally attached to an automatic system and the frame F and the vacuum plate V have controlled movement provided by a machine such as the Fuji-GSP II Screen Printer, manufactured by Fuji Machine Manufacturing Company of Japan, or other machines known to those skilled in the art.

Figure 2:
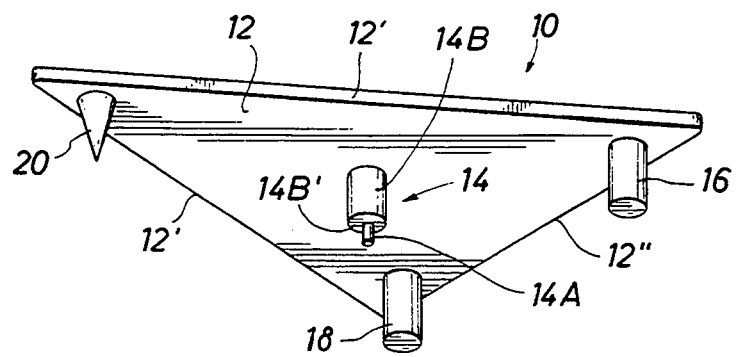
FIG. 2 is a perspective view of the apparatus of the present invention taken from its bottom surface.
Figure 4:
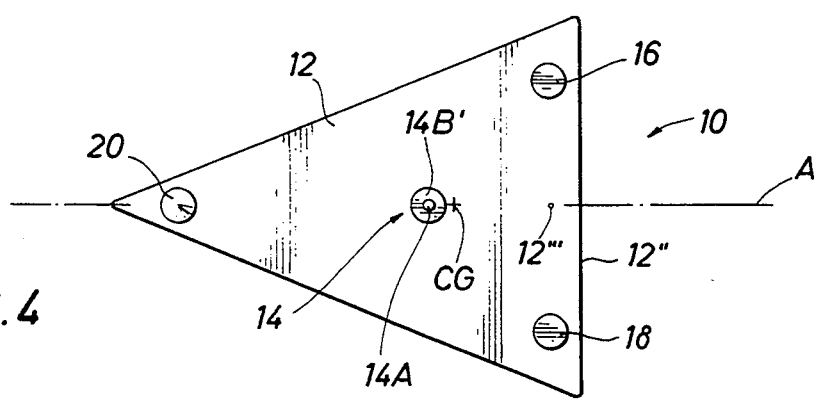
FIG. 4 is a bottom view of the apparatus of the present invention.

Turning now to FIG. 2, the apparatus 10 comprises a plate 12 having a lever member 14. The lever member 14 comprises a first cylindrical section or elongated member 14A that is sized to be received through a stencil hole H, as best seen in FIGS. 5 and 6, and a second cylindrical section 14B having a shoulder 14B'. Preferably, the hole H is larger than the diameter of member 14A but smaller than the diameter of the member 14B. For example, the hole H could be an opening for a 1206 rectangular or larger chip. The apparatus further comprises two support members 16, 18 for engaging the stencil surface M'. The plate 12 is shaped substantially as a triangle having two equi-distanced sides 12' and a base side 12''. The support members 16, 18 are preferably substantially cylindrical and are positioned adjacent the base side 12'' of the plate 12, as best shown in FIGS. 2 and 4. The indicator means or cone 20 is positioned adjacent the intersection of the two equi-distanced sides 12', as best shown in FIGS. 2 and 4. The ends of supports 16, 18 and cone 20, all having the same height, are coplanar. The height of the second cylindrical section 14B is less than the plane defined by the support members 16, 18 and cone 20. Preferably, the lever member 14 is positioned along the longitudinal axis A of the plate 12, as best seen in FIG. 4. The indicator cone 20 is also positioned on the longitudinal axis A of the plate 12. As shown in FIG. 4, the longitudinal distance between the base side 12' and the member 14A, along the longitudinal axis A, is less than the distance between the member 14A and the indicator cone 20. Preferably, the longitudinal distance between the member 14A and the indicator cone 20 is twice the longitudinal distance between the member 14A and the two support members 16, 18 taken along the longitudinal axis A. As best shown in FIG. 4, the centroid of weight of the apparatus 10 including the plate 12, the support members 16, 18, the lever member 14 and the indicator cone 20 is located between the support members 16, 18 and the lever member 14. In particular, the centroid is positioned along the longitudinal axis A between the lever member 14 and the base side 12''.

As best seen in FIG. 5, the apparatus 10 will pivot in this position since the centroid of weight is located between lever member 14 and support members 16, 18.

Figure 3:
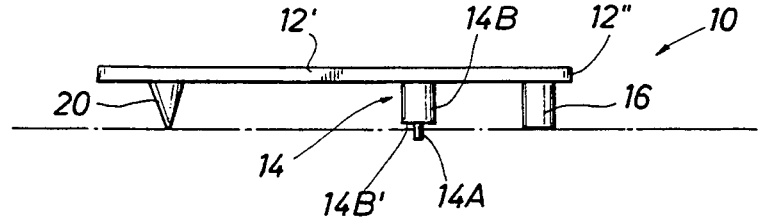
FIG. 3 is an elevational side view of the apparatus of the present invention shown in FIG. 2.

Preferably, the apparatus 10 has an overall length of 3.75'' from the base side 12'' to the tip of the triangular plate at the intersection of the two equidistanced sides 12' along the longitudinal axis A. The distance between the member 14A to the cone 20 is preferably 2'' and the distance from the member 14A to the intersection at 12''' of the longitudinal axis A and the line connecting the support members 16, 18 is 1''. The distance from 12''' to either the support member 16 or the support member 18 is 1''. The overall distance of the base side 12'' is 3''. The distance from the support member 16 or 18 to the base side 12'' is 0.25''. Preferably, the overall height of the support members 16, 18 and cone 20 with plate 12 is 0.50'', best shown in FIG. 3. The height of the second cylindrical section of the member 14B including the plate 12 is 0.45''. The distance between the plane defined by the ends of cone 20, and the support members 16, 18 to the tip of the first cylindrical member 14A is 0.048''. This distance is the snap-off (0.040'') plus the thickness of the stencil M (0.008'').

USE AND OPERATION

Turning now to FIGS. 5 and 6, a method is disclosed for positioning a stencil M at a predetermined snap-off from the circuit board B during a solder paste printing process. It is contemplated that this process will be used with an automated machine, such as the Fuji GSP-II Screen Printer, manufactured by Fuji Machine Manufacturing Company, Ltd. of Japan, though a manual crank apparatus could also be used.

After verifying the parameters explained in the background of the invention and other parameters known to those of ordinary skill in the art such as the proper positioning of stencil M in the frame F, and the relative parallelism between the stencil M, circuit board B and vacuum plate V, the board B is positioned on the vacuum plate V with the vacuum plate V being raised to its upper position. The apparatus 10, as shown in FIG. 5, is then positioned in a stencil hole H, preferably near the center of the circuit board B, with the cone 20 positioned closest to the operator. Therefore, in FIGS. 5 and 6, the operator would be on the left of the frame F and facing right. The operator should also at this time confirm that the selected hole H and engaging circuit board surface B' are free of solder paste.

The distance between the indicator cone 20 and the lever member 14 is preferably twice the distance from the lever member 14 to intersection point 12''', as shown in FIG. 4. This spacing positions the cone 20 above the stencil M twice the distance if the spacing were a one-to-one ratio to provide for more accurate gauging of the distance of the snap-off. Additionally the additional distance of the cone 20 from the lever member 14 allows the cone 20 to be positioned closer to the operator while the snap-off is measured in a centrally located position on the stencil M.

Turning now to FIG. 5, the board B is initially positioned closer to the stencil M than the predetermined snap-off so the apparatus pivots about members 16, 18. With the operator observing the cone 20, the vacuum plate V is lowered using the "snap-off" hand crank until the cone 20 engages the stencil surface M', as best shown in FIG. 6. In the preferred embodiment, the thickness of the stencil M, i.e. the distance between M' and M" is 0.008". Since the desired snap-off between the surface M" and the board B is 0.040", the distance from the plane defined by the support members 16, 18 and cone 20 to the tip of member 14A should be 0.048".

The vacuum plate V or stencil M should only be moved until the cone 20 initially engages the surface M' of the stencil M. At this point the snap-off is at the predetermined snap-off, e.g. 0.040". To set the snap-off at other than the predetermined distance the operator may use the dial indicator provided on the Fuji machine to increase or decrease the snap-off from the original desired setting Alternatively a set of apparatuses 10 could be provided where each tip of the member 14A extends from the plane defined by the support members 16, 18 and cone 20 at varying predetermined distances For example a set of apparatuses could have the tip of member 14A extend from the defined plane at 0.35", 0.40" or 0.45".

Furthermore, it is contemplated that a single apparatus could be provided similar to apparatus 10 but with the member 14A movable relative to the member 14B, either by screw or telescoping motion, to provide varying distances such as described above.

Alternatively, from the method disclosed above, the apparatus 10 could be initially placed on the stencil M with the circuit board B spaced apart at a distance from the stencil M so that member 14A does not engage the board B. The cone 20 and the support members 16, 18 would then all be initially engaging the stencil M. The vacuum plate V and the board B would then be raised (or the stencil M could be lowered) until the board surface B' engages member 14A. Further upward movement of the board B would cause the cone 20 to disengage from the stencil surface M' thereby indicating the predetermined snap-off of the circuit board B relative to the stencil M.

The foregoing disclosure and description of the invention are illustrative and explanatory thereof, and various changes in the size, shape and materials, as well as in the details of the illustrated construction may be made without departing from the spirit of the invention.

What is claimed is:

1. Apparatus for indicating a predetermined distance between a first surface and a second surface having a hole therethrough comprising
   a plate having a longitudinal axis and having a support member disposed on said plate on each side of said longitudinal axis;
   a lever member disposed on said plate for extending through the hole to engage the first surface; and
   indicator means disposed on said plate for indicating the positioning of the first surface relative to the second surface, said lever member attached to said plate within a triangle defined by said two support members and said indicator means wherein said plate is rotated by said lever member about said support members to move said indicator means to indicate the predetermined distance.

2. Apparatus of claim 1 wherein a longitudinal centroid of weight of the apparatus is between said two support members and said lever member.

3. Apparatus of claim 2 wherein a longitudinal distance between said two support members and said lever member is less than a longitudinal distance between said lever member and said indicator means.

4. Apparatus of claim 3 wherein the longitudinal distance between said lever member and said indicator means is twice the longitudinal distance between said lever member and said two support members.

5. Apparatus of claim 2 further comprising the indicator means is substantially shaped as a cone having a tip on an end opposite an end attached to said plate wherein said cone tip and each end of said support members opposite an end attached to said plate defining a plane whereby a distance between the end of the lever member and the plane is equal to the predetermined distance.

6. Apparatus of claim 2 wherein said lever member comprises a first cylindrical section engaging a second cylindrical section having a shoulder.

7. Apparatus of claim 6 wherein the height of said second cylindrical section is less than the height of one of said support members.

8. Apparatus of claim 1 wherein said plate is shaped substantially as a triangle.

9. Apparatus of claim 8 wherein said plate has two equidistant sides and a base side.

10. Apparatus of claim 9 wherein said support members are substantially cylindrical and are positioned adjacent said plate base side.

11. Apparatus of claim 10 wherein said indicator means is substantially shaped as a cone and is positioned adjacent the intersection of the two equidistant sides.

12. A method for positioning a mask at a predetermined distance from a circuit board for a solder paste printing process, comprising the steps of:
   positioning a plate, having a lever member and an indicator means, on the mask with a portion of said lever member extending through a hole in the mask, a centroid of weight of said plate being behind said lever member and said indicator means,
   positioning the mask at a distance less than the predetermined distance from the board so that said lever member, extending through the hole in the mask, engages the board, and
   moving the board relative to the mask until said indicator means engages the mask to indicate positioning at the predetermined distance.

13. Method of claim 12 wherein said plate further comprises two support members and the centroid of weight of the plate is between said two support members and said lever member, further comprising the step of
   positioning said two support members on the mask.

14. Method of claim 12 further comprising the step of:
   positioning the plate so that said indicator means is closest to the operator.

15. A method for positioning a mask at a predetermined distance from a circuit board for a solder paste printing process, comprising the steps of:

positioning a plate, having a lever member and an indicator means, on the mask with a portion of said lever member extending through a hole in the mask, a centroid of weight of the plate being behind said lever member and said indicator means, positioning the mask at a distance greater than the predetermined distance from the board so that said lever member, extending through the hole in the mask, does not engage the board, and moving the board relative to the mask until said indicator means disengages from the mask to indicate positioning at the predetermined distance.

16. Method of claim 15 wherein said plate further comprises two support members and the centroid of weight of the plate is between said two support members and said lever member, further comprising the step of:

positioning said two support members on the mask.

17. Apparatus for indicating a predetermined distance between a first surface and a second surface having a hole therethrough, wherein said second surface is positioned directly above said first surface, said apparatus comprising a one-piece plate having a thickness;

an elongated member disposed on said plate and extending a length away from said plate, said elongated member length and said plate thickness defining a given dimension, a portion of said elongated member sized for extending through the second surface hole to engage the first surface;

indicator means disposed on said plate and extending a length away from said plate for indicating the positioning of the first surface relative to the second surface wherein said given dimension is less than the distance x between said indicator means and said elongated member, said indicator means length and said plate thickness being less than said given dimension; and two support members disposed on said plate wherein one of said support members is spaced apart from said elongated member a distance y that is less than the distance x between said indicator means and said elongated member.

18. Apparatus of claim 17 wherein said elongated member is positioned on a longitudinal axis of said plate between said support members and said indicator means.

19. Apparatus of claim 17 wherein a longitudinal centroid of weight of the apparatus is between said two support members and said elongated member wherein said plate is rotated by said elongated member about said support members to move said elongated member to indicate the predetermined distance.

20. Apparatus for indicating a predetermined distance, comprising:

a plate having a longitudinal axis;

support members having an attached end and an opposed end, said attached end of each support member disposed on said plate with one support member on each side of said longitudinal axis;

indicator means having an attached end and an opposed end, said indicator means attached end disposed on said plate for indicating the predetermined distance; and a lever member having an attached end and an opposed end said lever member attached end disposed on said plate between said support members and said indicator means wherein said opposed end of said indicator means and said opposed ends of said support members defining a plane so that the distance between the opposed end of the lever member and the plane is equal to the predetermined distance wherein said plate is rotated by said lever member about said support members to move said indicator means to indicate the predetermined distance.

21. Apparatus of claim 20 wherein said lever member comprises a first cylindrical section engaging a second cylindrical section having a shoulder.

* * * * *